United States Patent
Gunjishima et al.

(10) Patent No.: US 10,125,435 B2
(45) Date of Patent: Nov. 13, 2018

(54) SIC SINGLE CRYSTAL, SIC WAFER, SIC SUBSTRATE, AND SIC DEVICE

(71) Applicants: KABUSHIKI KAISHA TOYOTA CHUO KENKYUSHO, Nagakute-shi, Aichi-ken (JP); DENSO CORPORATION, Kariya-shi, Aichi-ken (JP); SHOWA DENKO K.K., Tokyo (JP)

(72) Inventors: Itaru Gunjishima, Nagakute (JP); Yusuke Kanzawa, Nagakute (JP); Yasushi Urakami, Miyoshi (JP); Masakazu Kobayashi, Hikone (JP)

(73) Assignees: KABUSHIKI KAISHA TOYOTA CHUO KENKYUSHO, Nagakute (JP); DENSO CORPORATION, Kariya (JP); SHOWA DENKO K.K., Tokyo (JP)

( * ) Notice: Subject to any disclaimer, the term of this patent is extended or adjusted under 35 U.S.C. 154(b) by 546 days.

(21) Appl. No.: 14/650,169

(22) PCT Filed: Feb. 7, 2014

(86) PCT No.: PCT/JP2014/000650
§ 371 (c)(1),
(2) Date: Jun. 5, 2015

(87) PCT Pub. No.: WO2014/129137
PCT Pub. Date: Aug. 28, 2014

(65) Prior Publication Data
US 2015/0308014 A1  Oct. 29, 2015

(30) Foreign Application Priority Data
Feb. 20, 2013 (JP) .................. 2013-031554

(51) Int. Cl.
C30B 29/36 (2006.01)
H01L 29/32 (2006.01)
(Continued)

(52) U.S. Cl.
CPC ............ C30B 29/36 (2013.01); C30B 23/025 (2013.01); C30B 29/64 (2013.01); H01L 29/045 (2013.01);
(Continued)

(58) Field of Classification Search
None
See application file for complete search history.

(56) References Cited

U.S. PATENT DOCUMENTS

2010/0200866 A1* 8/2010 Kitou ............... C30B 25/20
257/77
2012/0060751 A1  3/2012 Urakami et al.
(Continued)

FOREIGN PATENT DOCUMENTS

JP  H10-45499 A   2/1998
JP  2006225232 A  8/2006
(Continued)

OTHER PUBLICATIONS

Jan. 10, 2017 Office Action issued in Japanese Patent Application No. 2013-031554.
(Continued)

Primary Examiner — Guinever S Gregorio
(74) Attorney, Agent, or Firm — Oliff PLC

(57) ABSTRACT

A SiC single crystal includes, in a plane substantially parallel to a c-plane thereof, a region (A) in which edge dislocations having a Burgers vector (A) in a specific direction are unevenly distributed, and a region (B) in which basal plane dislocations having a Burgers vector (B) in a specific direction are unevenly distributed. The region (A) is (Continued)

located in a <1-100> direction with respect to a facet portion, while the region (B) is located in a <11-20> direction with respect to the facet portion. A SiC substrate is produced by cutting a SiC wafer from the SiC single crystal in a direction substantially parallel to the c-plane, and cutting the SiC substrate from the SiC wafer such that the SiC substrate mainly contains one of the region (A) and the region (B). A SiC device is fabricated using the SiC substrate.

14 Claims, 11 Drawing Sheets

(51) Int. Cl.
| | |
|---|---|
| *H01L 29/04* | (2006.01) |
| *H01L 29/16* | (2006.01) |
| *C30B 23/02* | (2006.01) |
| *C30B 29/64* | (2006.01) |
| *C30B 19/12* | (2006.01) |
| *C30B 25/18* | (2006.01) |

(52) U.S. Cl.
CPC .......... *H01L 29/1608* (2013.01); *H01L 29/32* (2013.01); *C30B 19/12* (2013.01); *C30B 25/186* (2013.01)

(56) References Cited

U.S. PATENT DOCUMENTS

2014/0027787 A1* 1/2014 Gunjishima .......... H01L 29/045
    257/77
2017/0067183 A1* 3/2017 Seki ..................... C30B 9/12

FOREIGN PATENT DOCUMENTS

| JP | 2012046377 A | 3/2012 |
| WO | 2012157654 A1 | 11/2012 |

OTHER PUBLICATIONS

Apr. 28, 2014 International Search Report issued in International Application No. PCT/JP2014/000650.
Apr. 28, 2014 Written Opinoin issued in International Application No. PCT/JP2014/000650.

* cited by examiner

[Fig. 1]
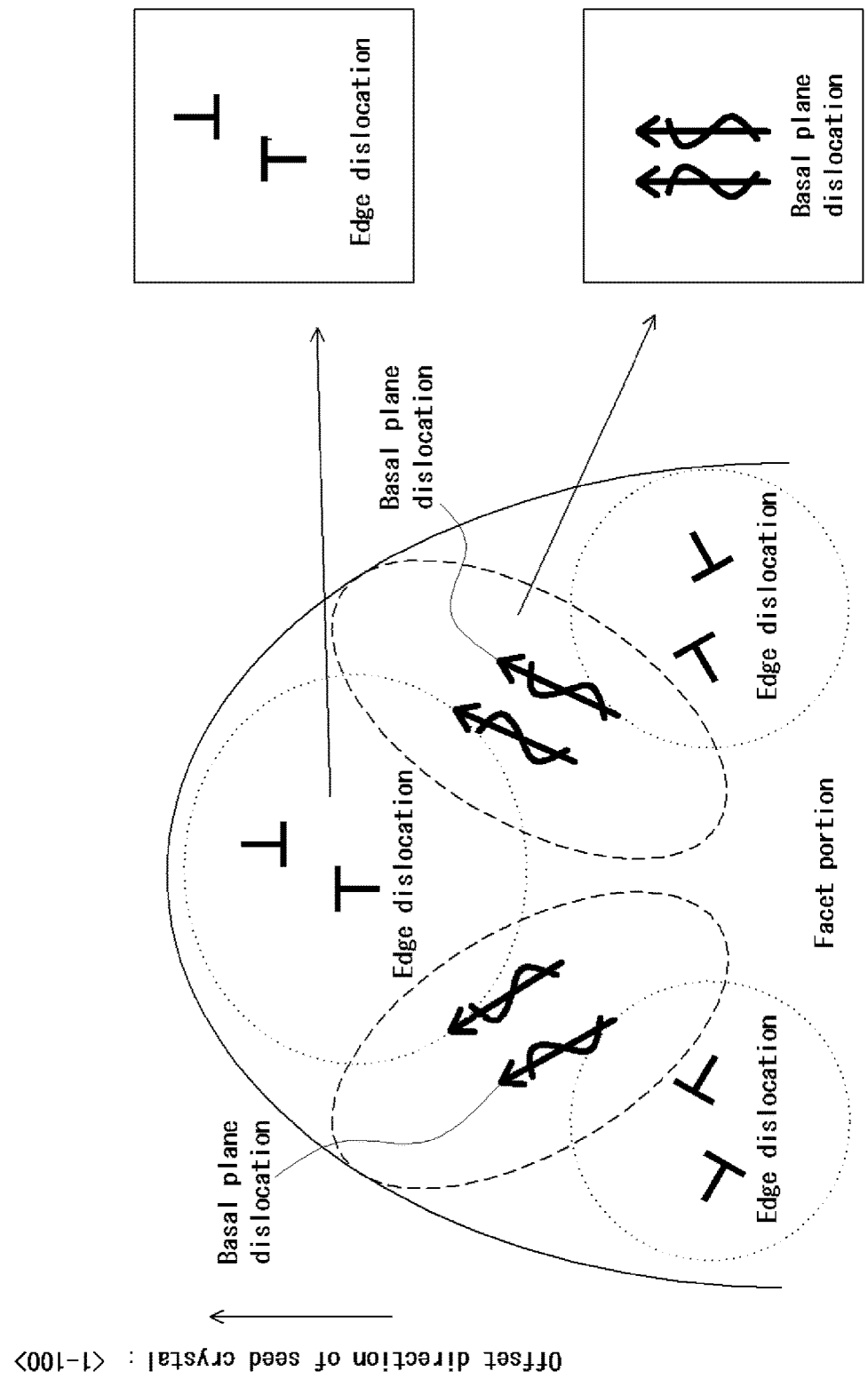

[Fig. 2]
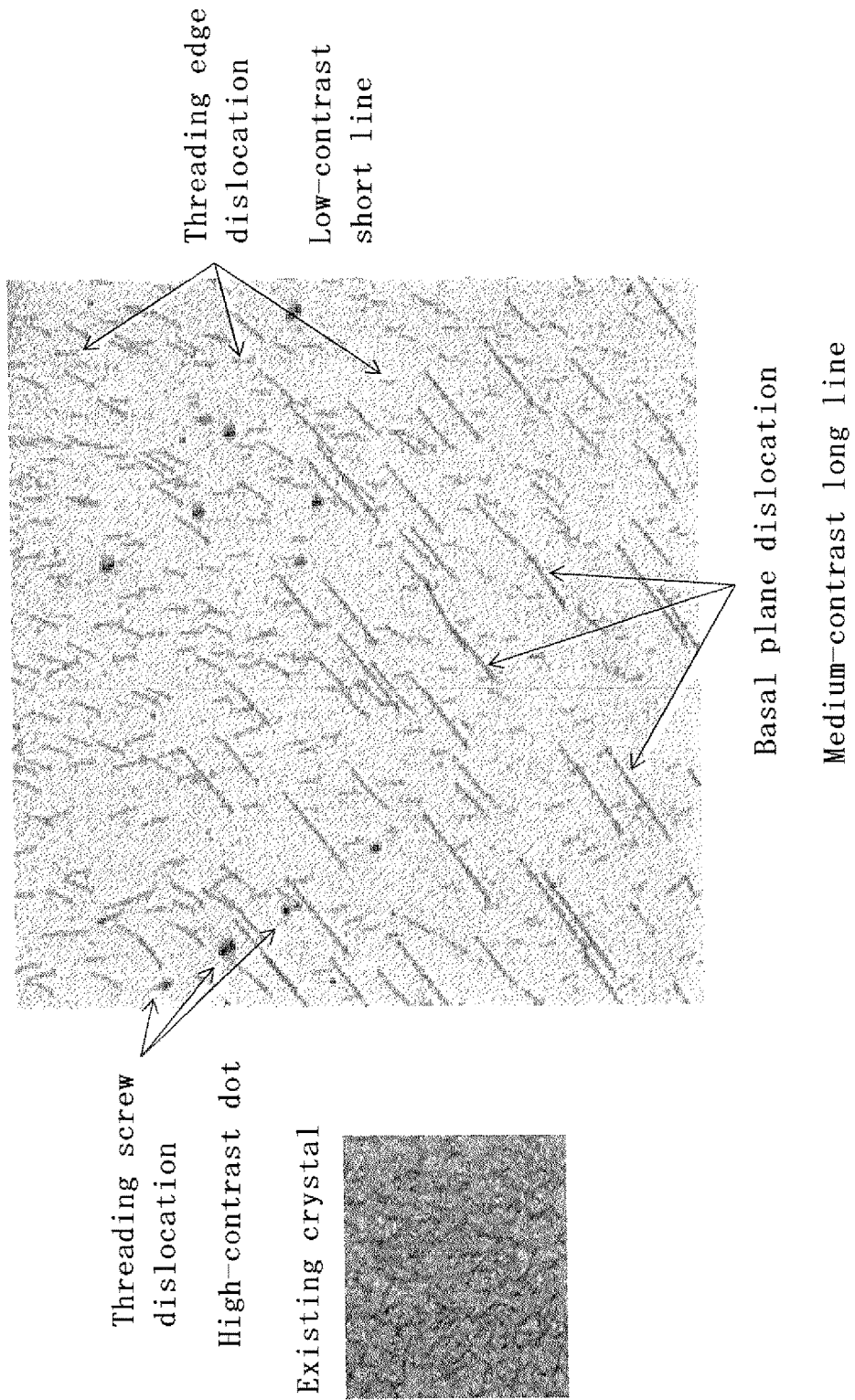

[Fig. 3]
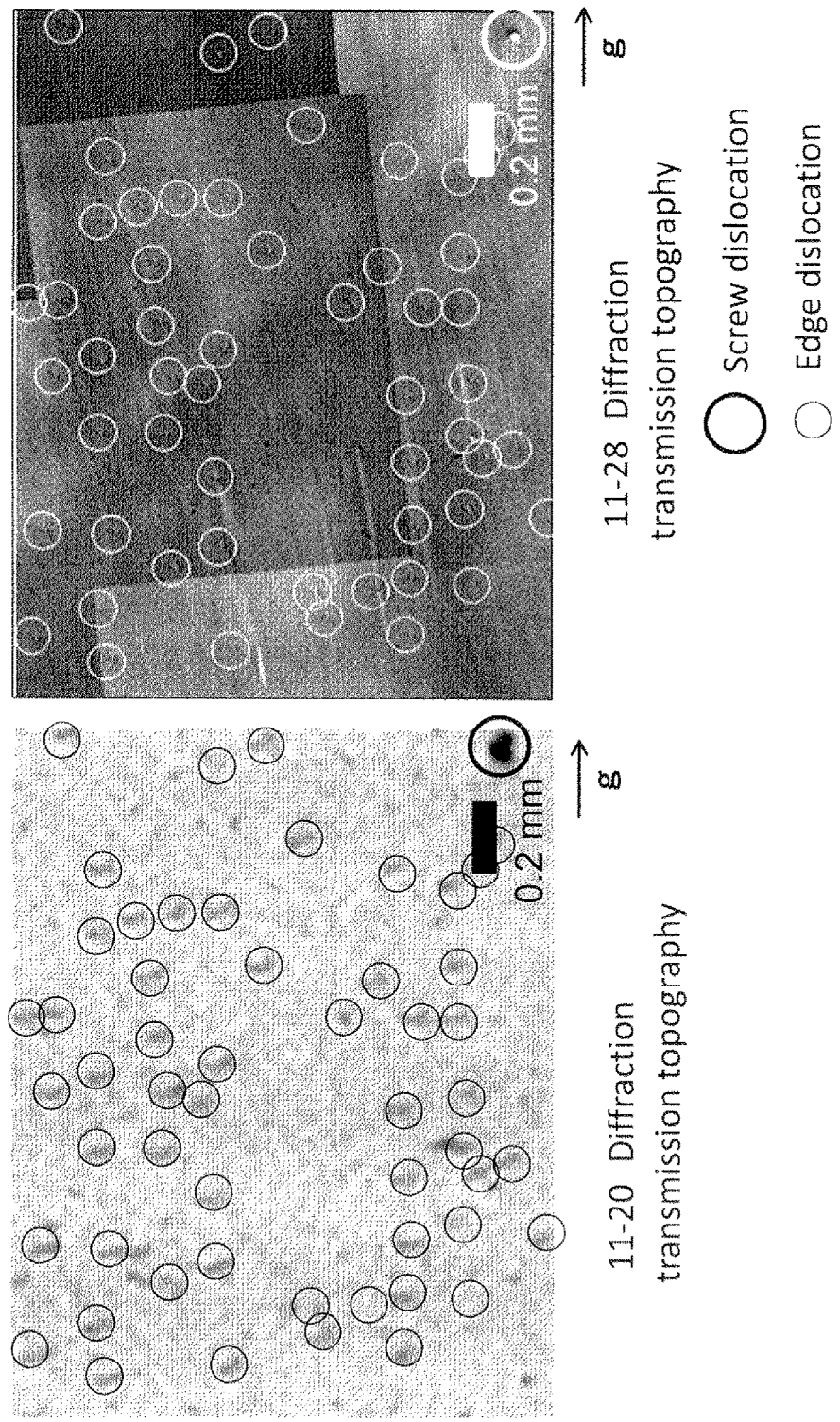

[Fig. 4]
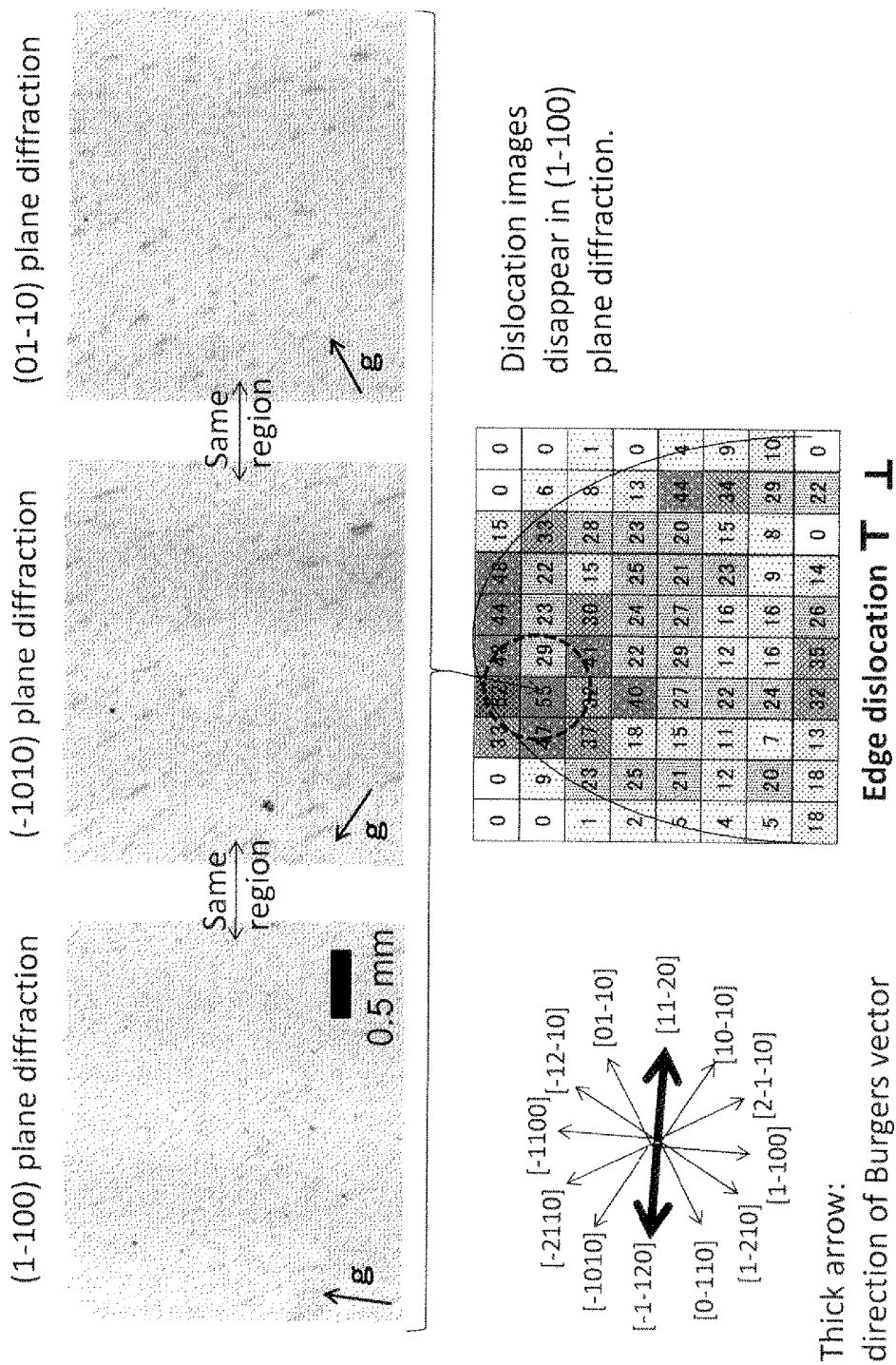

[Fig. 5]
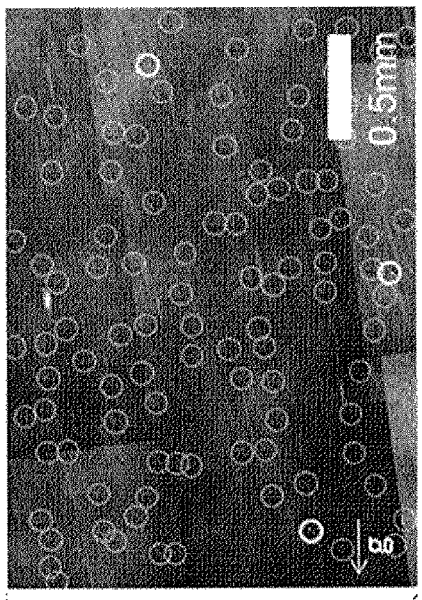
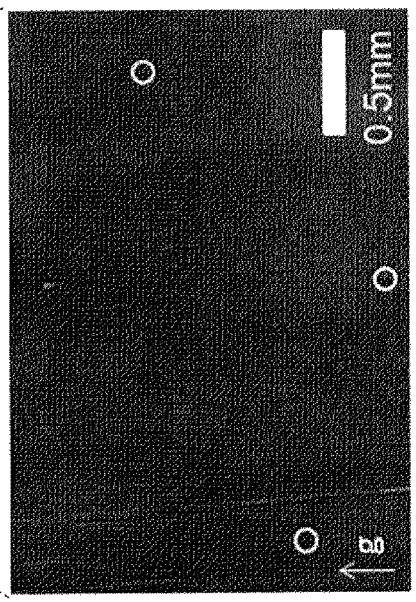
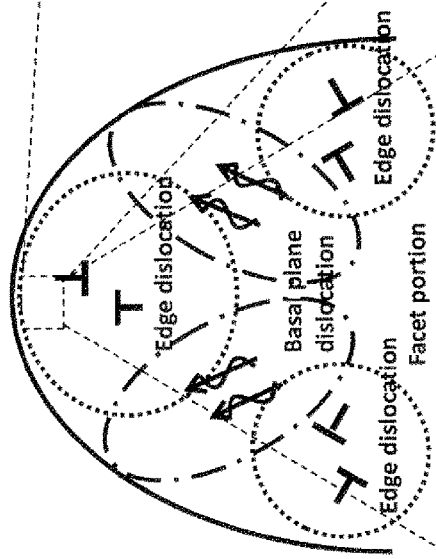

[Fig. 6]
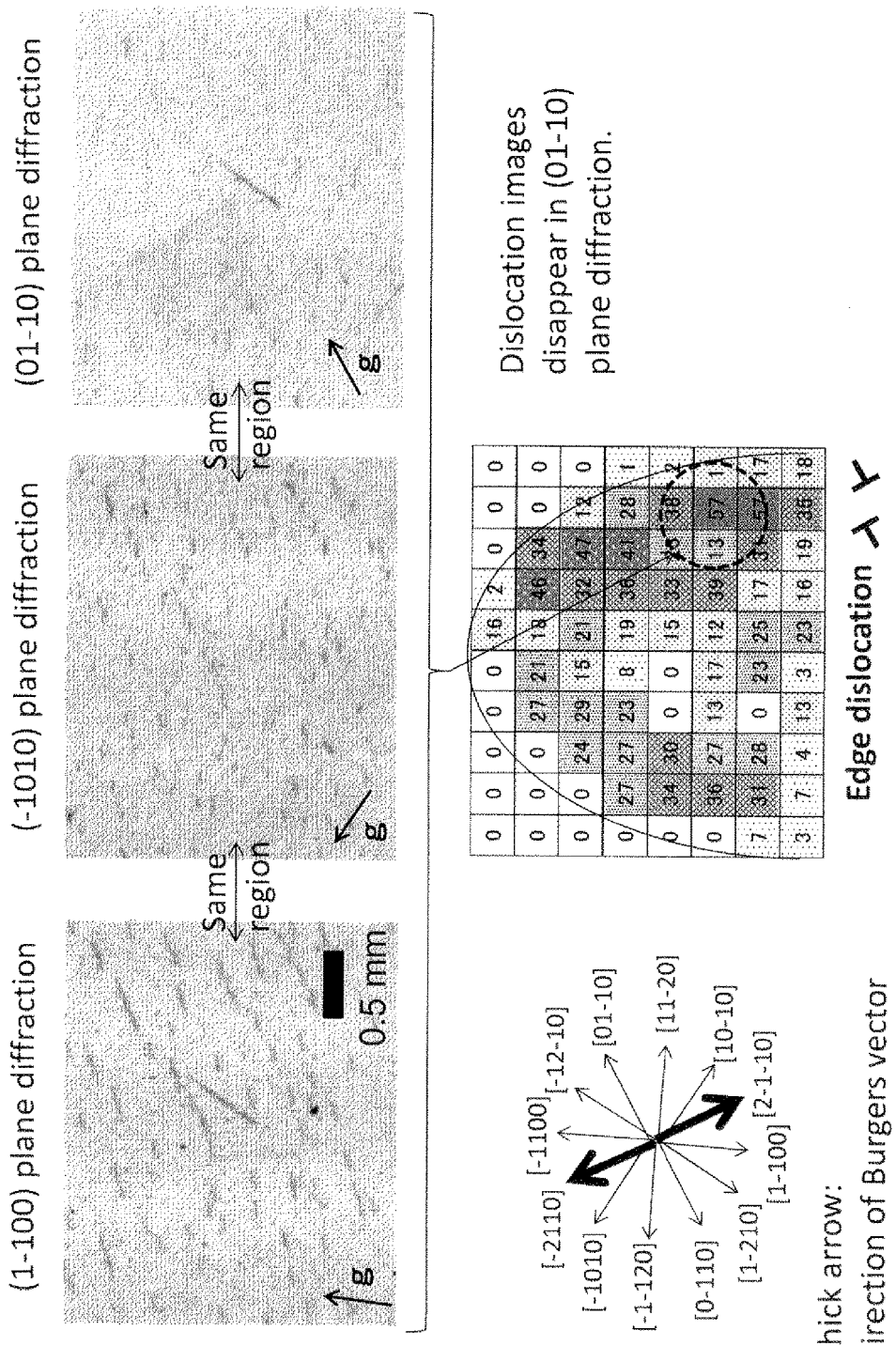

[Fig. 7]
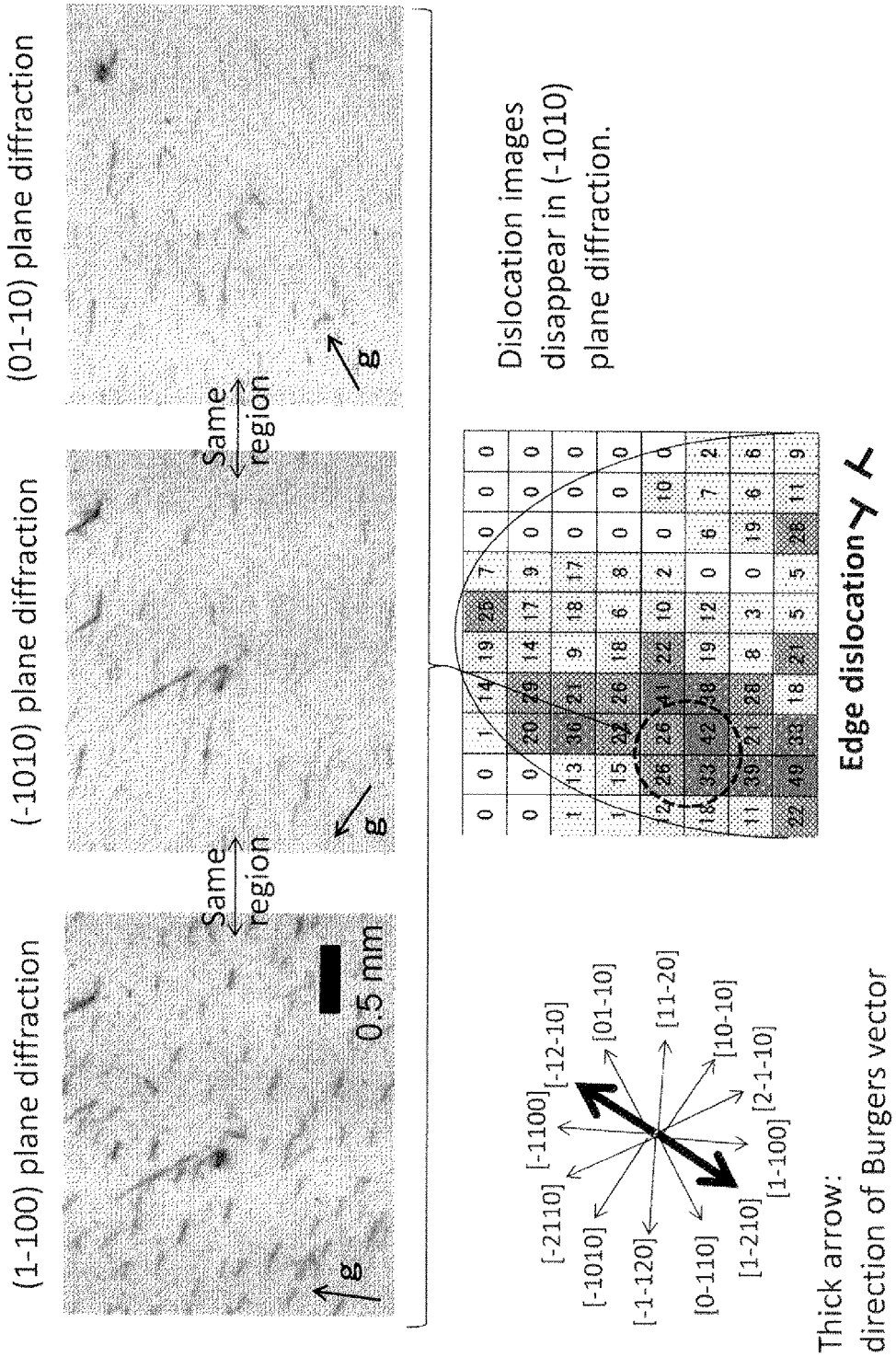

[Fig. 8]
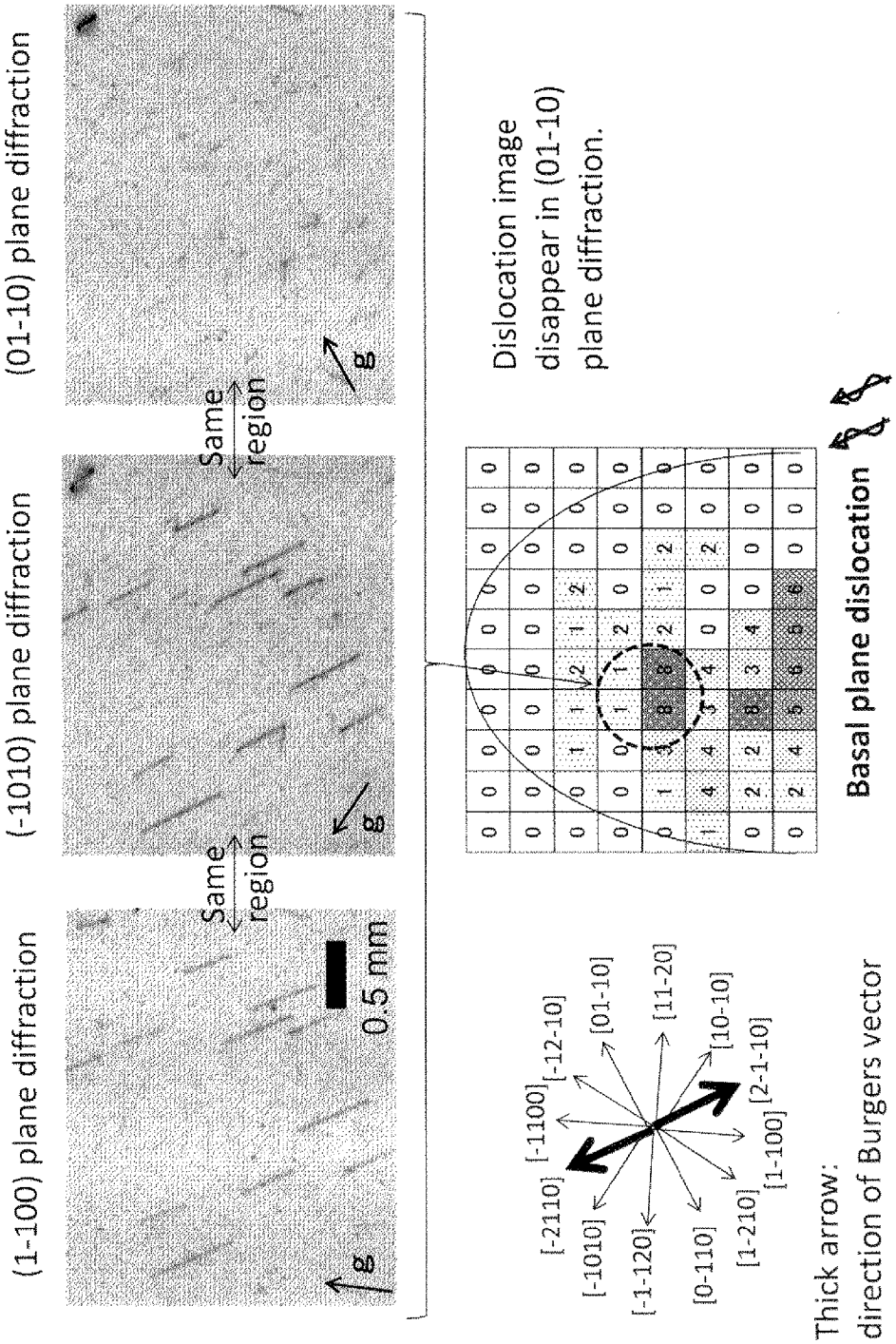

[Fig. 9]
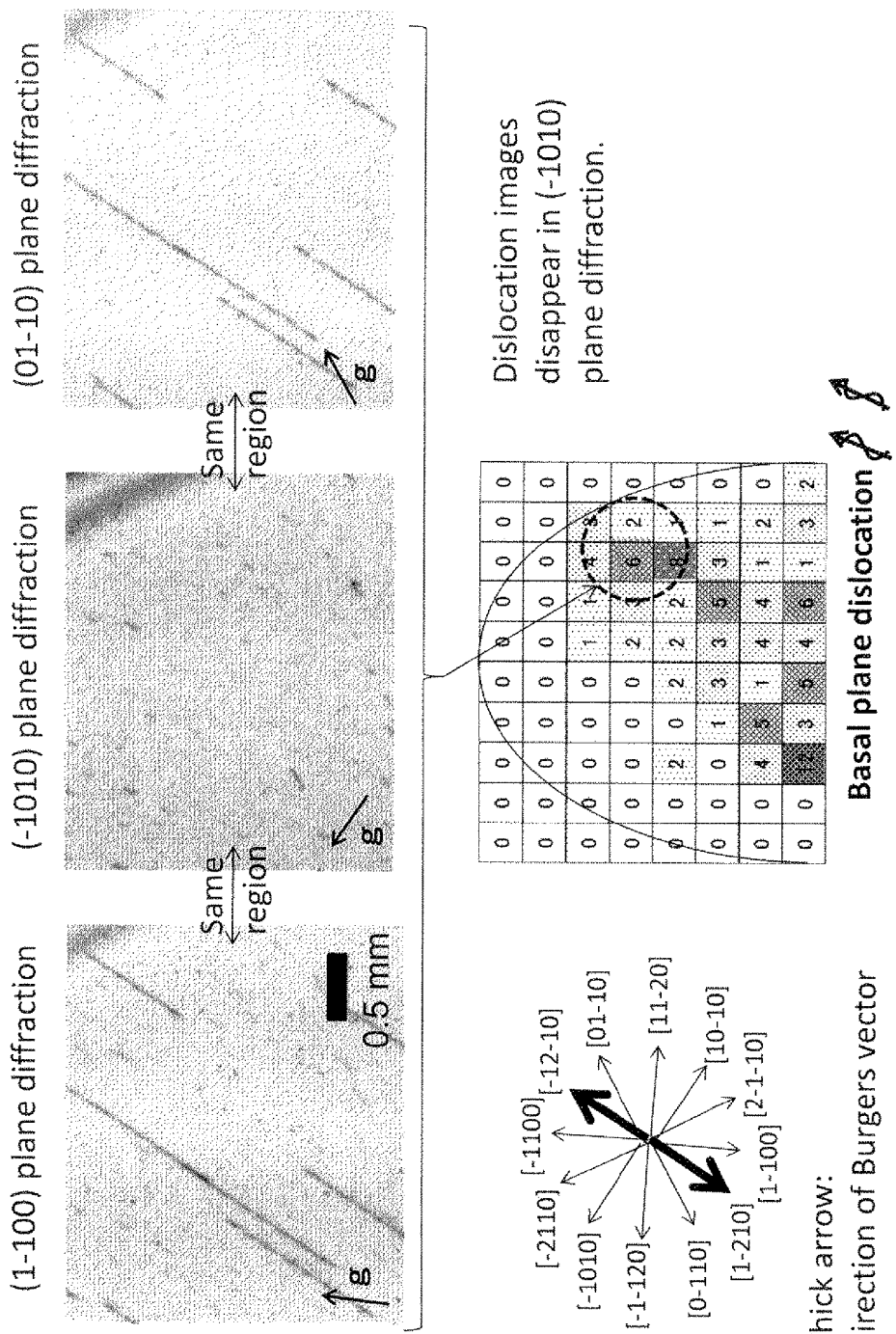

[Fig. 10]
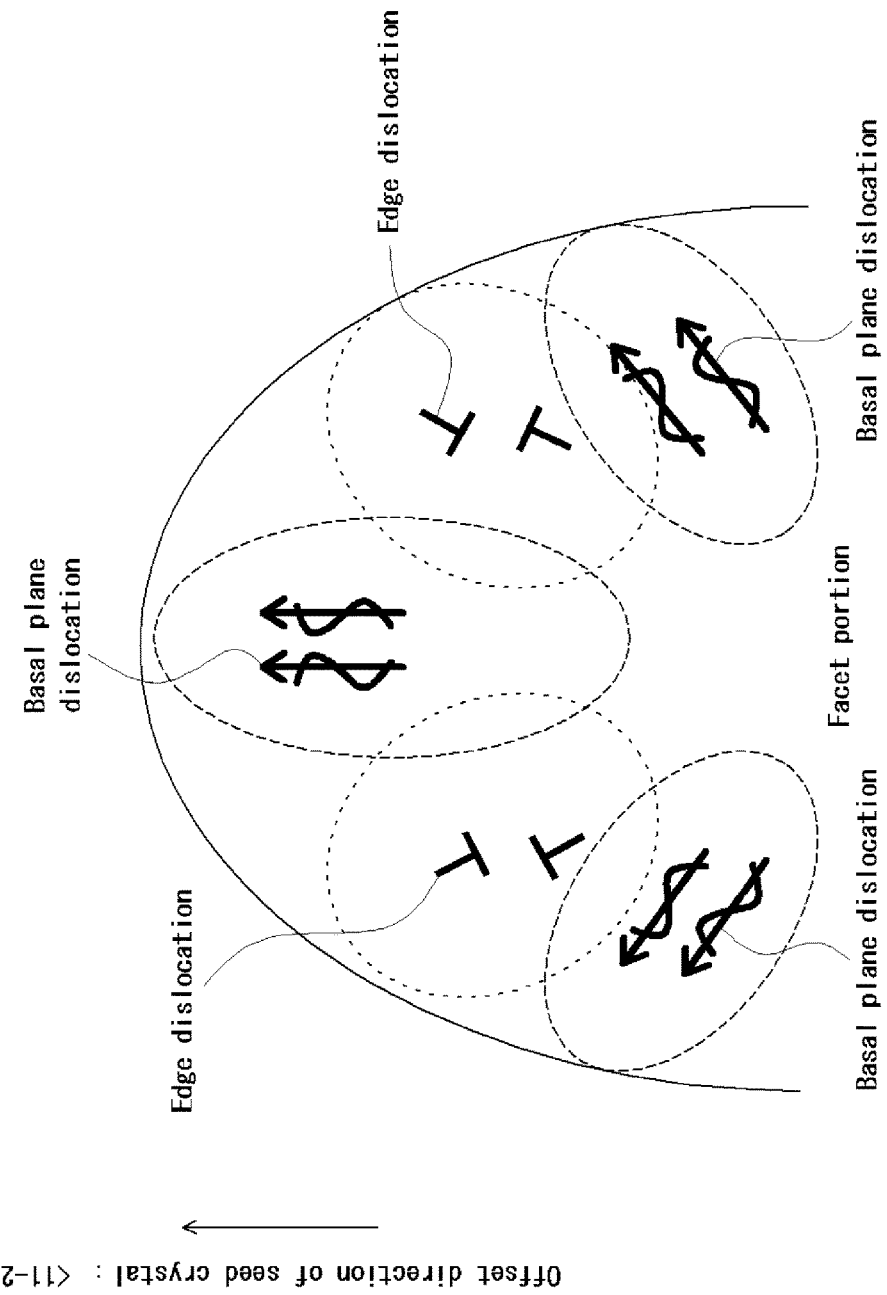

[Fig. 11]
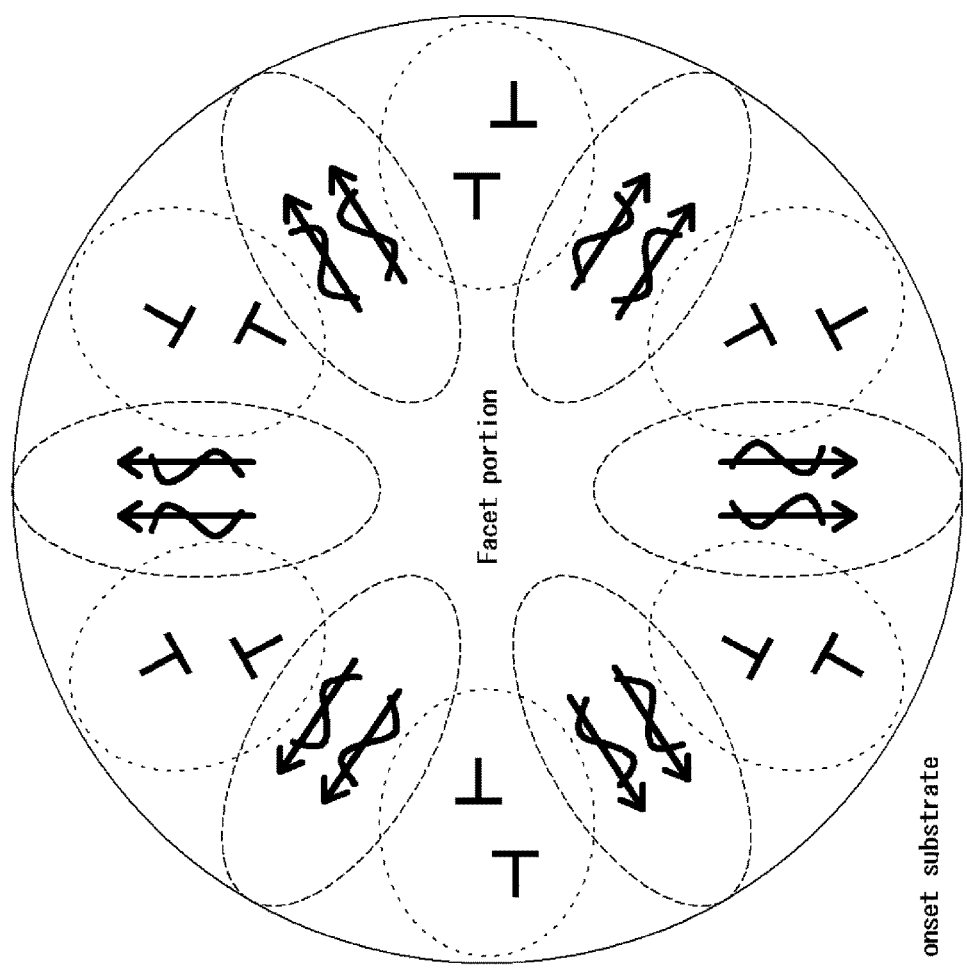

SIC SINGLE CRYSTAL, SIC WAFER, SIC SUBSTRATE, AND SIC DEVICE

TECHNICAL FIELD

The present invention relates to a SiC single crystal, a SiC wafer, a SiC substrate, and a SiC device, and particularly relates to a SiC single crystal in which a specific dislocation type unevenly exists in a specific region, a SiC wafer and a SiC substrate cut from such a SiC single crystal, and a SiC device fabricated using such a SiC wafer or SiC substrate.

BACKGROUND ART

SiC has been the subject of interest as a substrate material as a successor of Si for a next-generation power device. However, existing SiC contains many dislocations, which greatly affect device characteristics, compared with Si. Hence, various proposals have been made on a technique that decreases dislocations in a SiC single crystal.

For example, Patent Literature 1 discloses a technique where a conical seed crystal, of which the central axis direction is within plus or minus 10 degrees from the <0001> direction and the vertical angle is 20 degrees to 90 degrees, is used in order to decrease micropipes and screw dislocations in a grown crystal.

Patent Literature 2 discloses a technique where crystal growth is repeated with a growth plane provided with an offset angle of 20 degrees or more from a {0001} plane.

Furthermore, Patent Literature 3 proposes a technique where a seed crystal, of which the growth plane is processed in shape such that an offset angle of the growth plane is decreased along a direction from a lower part of a {0001} plane to a highest part of the {0001} plane on the growth plane, is used to prevent a dislocation flow from an offset upstream portion into an offset downstream portion.

To improve device characteristics, dislocations in a crystal are desirably decreased as possible. On the other hand, not only overall reduction of dislocations in the SiC single crystal, but also a technique of grouping dislocations into specific dislocation types or into specific Burgers vectors is also considered to be an effective approach for improving device characteristics.

Dislocations in SiC include screw dislocation, edge dislocation, and basal plane dislocation. There has been reported influence of each dislocation type on a device, such as an increase in leakage current caused by a threading dislocation such as a screw dislocation and an edge dislocation, and forward degradation of a bipolar device caused by a basal plane dislocation. Thus, if a SiC single crystal, in which a specific dislocation type is reduced, can be manufactured, and when the SiC single crystal is used in correspondence to a type of a device to be fabricated, a characteristic as an issue of that device can be improved.

In a previous attempt, basal plane dislocations in a substrate are converted into edge dislocations at an increased rate during epitaxial growth. Such an attempt, however, has not achieved conversion of all basal plane dislocations into edge dislocations. One possible reason for this is as follows. A plurality of Burgers vector directions exist in the basal plane dislocations, and a basal plane dislocation having a Burgers vector parallel to an offset direction of the substrate is difficult to be converted into edge dislocation.

Thus, it is considered that when a substrate, which mainly contains basal plane dislocations having a Burgers vector in a specific direction (i.e., contains no basal plane dislocation having a Burgers vector parallel to the offset direction), is fabricated, conversion efficiency of basal plane dislocations into edge dislocations can be improved.

However, a specific technique where a SiC single crystal is grown so as to mainly contain a specific dislocation type, or a specific technique where a SiC single crystal is grown so as to exclusively contain a specific Burgers vector has not been known. In addition, there has been no attempt of exclusively forming, in a wafer surface, a specific dislocation type or a dislocation type having a specific Burgers vector in a specific region.

CITATION LIST

Patent Literature

PTL 1: Japanese Unexamined Patent Application Publication No. H10-045499.
PTL 2: Japanese Unexamined Patent Application Publication No. 2006-225232.
PTL 3: Japanese Unexamined Patent Application Publication No. 2012-046377.

SUMMARY OF INVENTION

Technical Problem

Problems that the present invention is to solve are to provide a SiC single crystal in which a specific dislocation type unevenly exists in a specific region, a SiC wafer and a SiC substrate cut from such a SiC single crystal, and a SiC device fabricated using such a SiC wafer or a SiC substrate.

Solution to Problem

To solve the above-described problems, a SiC single crystal according to the present invention is summarized by including
in a plane substantially parallel to a c-plane,
(a) a region (A) in which edge dislocations having a Burgers vector (A) in a specific direction are unevenly distributed, and
(b) a region (B) in which basal plane dislocations having a Burgers vector (B) in a specific direction are unevenly distributed.

A SiC wafer according to the present invention is cut in a specific direction from the SiC single crystal according to the present invention.

A SiC substrate according to the present invention is produced by
cutting a SiC wafer from the SiC single crystal according to the present invention in a direction substantially parallel to a c-plane of the SiC single crystal, and
cutting the SiC substrate from the SiC wafer such that the SiC substrate mainly contains one of the region (A) and the region (B).

Furthermore, a SiC device according to the present invention is fabricated using the SiC wafer or the SiC substrate according to the present invention.

Advantageous Effects of Invention

In the case of c-plane growth of the SiC single crystal, when a shape of a seed crystal (i.e., a shape of a c-plane facet in an initial stage of growth, size of a region for supplying a screw dislocation to the c-plane facet, etc.) and a growth condition are optimized, a SiC single crystal, in which a specific dislocation type having a Burgers vector in a specific direction unevenly exists in a specific region, is produced. When a SiC substrate is cut from such a SiC single crystal, and when a cutting position and a cutting size are each optimized, a SiC substrate that mainly contains a specific dislocation type (in other words, a SiC substrate that does not substantially contain or slightly contains a specific dislocation type) is produced.

When a SiC device is fabricated using such a SiC substrate, degradation in characteristics due to a specific dislocation type can be suppressed. Similarly, when a SiC single crystal is grown using such a SiC substrate as a seed crystal, and when a SiC device is fabricated using the SiC single crystal, degradation in characteristics due to a specific dislocation type can be suppressed.

BRIEF DESCRIPTION OF DRAWINGS

FIG. 1 includes schematic diagrams of a SiC wafer that is cut from a SiC single crystal according to the present invention in a direction substantially parallel to a c-plane of the SiC single crystal (a left drawing), and of SiC substrates cut from the SiC wafer (an upper right drawing and a lower right drawing).

FIG. 2 includes exemplary transmission X-ray topography images for explaining a determination method of various types of dislocation with transmission X-ray topography.

FIG. 3 includes a transmission X-ray topography image (a left drawing) and a reflection X-ray topography image (a right drawing) photographed in the same region of a SiC wafer.

FIG. 4 includes a (1-100) plane diffraction image, a (-1010) plane diffraction image, and a (01-10) plane diffraction image photographed in the same region that is located in a [-1100] direction with respect to a facet portion, and contains unevenly distributed edge dislocations.

FIG. 5 includes a schematic diagram of a SiC wafer (an upper left drawing), a 2-2010-diffraction reflection-X-ray topography image photographed in a region located in a [-1100] direction with respect to a facet portion (a lower left drawing), and a 11-28-diffraction reflection-X-ray topography image photographed in the same region (an upper right drawing).

FIG. 6 includes a (1-100) plane diffraction image, a (-1010) plane diffraction image, and a (01-10) plane diffraction image photographed in the same region that is located in a [01-10] direction with respect to a facet portion, and contains unevenly distributed edge dislocations.

FIG. 7 includes a (1-100) plane diffraction image, a (-1010) plane diffraction image, and a (01-10) plane diffraction image photographed in the same region that is located in a [-1010] direction with respect to a facet portion, and contains unevenly distributed edge dislocations.

FIG. 8 includes a (1-100) plane diffraction image, a (-1010) plane diffraction image, and a (01-10) plane diffraction image photographed in the same region that is located in a [-21-10] direction with respect to a facet portion, and contains unevenly distributed basal plane dislocations.

FIG. 9 includes a (1-100) plane diffraction image, a (-1010) plane diffraction image, and a (01-10) plane diffraction image photographed in the same region that is located in a [-12-10] direction with respect to a facet portion, and contains unevenly distributed basal plane dislocations.

FIG. 10 is a dislocation distribution diagram of a SiC single crystal produced in Example 2.

FIG. 11 is a dislocation distribution diagram of a SiC single crystal produced in Example 3.

DESCRIPTION OF EMBODIMENTS

An embodiment of the present invention will now be described in detail.

1. Definition of Terms

A term *c-plane* refers to {0001} plane.

A term *plane substantially parallel to a c-plane* refers to a plane having an offset angle of 20 degrees or less with respect to a c-plane.

A term *c-plane growth* refers to growth of a single crystal with a plane substantially parallel to a c-plane as a growth plane.

A term *offset angle* refers to an angle defined by a normal vector of a certain plane and a normal vector of a c-plane.

A term *offset direction* refers to a direction parallel to a vector as a projection of a normal vector of a certain plane onto a c-plane.

A term *offset substrate* refers to a substrate composed of a single crystal having an offset angle of a growth plane of 0.5 degrees to 30 degrees.

A term *onset substrate* refers to a substrate composed of a single crystal having an offset angle of a growth plane of less than 0.5 degrees.

A term *facet portion* refers to a region in which a c-plane facet is formed.

A term *c-plane facet* refers to a region in which a crystallographically highest {0001} plane exists during growth of a single crystal.

A term *threading edge dislocation (or simply *edge dislocation*)* refers to a dislocation having a dislocation line that is substantially perpendicular to a {0001} plane (basal plane), and having a Burgers vector that is parallel to a <11-20> direction.

A term *basal plane dislocation* refers to
(a) an edge dislocation having a dislocation line that is located on a {0001} plane (basal plane), and having a Burgers vector that is parallel to a <11-20> direction,
(b) a screw dislocation having a dislocation line that is located on a {0001} plane (basal plane), and having a Burgers vector that is parallel to a <11-20> direction, or
(c) a mixed dislocation of (a) and (b).

A term *threading screw dislocation* refers to a dislocation having a dislocation line that is substantially perpendicular to a {0001} plane (basal plane), and having a Burgers vector that is parallel to a <0001> direction.

2. SiC Single Crystal

A SiC single crystal according to the present invention includes, in a plane substantially parallel to a c-plane,
(a) a region (A) in which edge dislocations having a Burgers vector (A) in a specific direction are unevenly distributed, and
(b) a region (B) in which basal plane dislocations having a Burgers vector (B) in a specific direction are unevenly distributed.

(2.1 Region (A) and Region (B))

The left drawing of FIG. 1 illustrates a schematic diagram of a SiC wafer that is cut from the SiC single crystal according to the present invention in a direction substantially parallel to a c-plane of the SiC single crystal.

In the exemplary case illustrated in FIG. 1, the SiC wafer has a semielliptical shape, and a facet portion exists in a substantially lower part of the semielliptical shape. The region (A) in which edge dislocations having a Burgers vector (A) in a specific direction are unevenly distributed, and the region (B) in which basal plane dislocations having a Burgers vector (B) in a specific direction are unevenly distributed exist on the SiC wafer.

In the region (A), the number of edge dislocations having the Burgers vector (A) in the specific direction is larger than the number of other edge dislocations.

When a manufacturing condition is optimized, in a certain region on the wafer, a ratio ($=n_e*100/(n_e+n_{other})$ (%)) of the number ($n_e$) of edge dislocations having the Burgers vector (A) in the specific direction to the sum of the number ($n_e$) of edge dislocations having the Burgers vector (A) in the specific direction and the number ($n_{other}$) of other edge dislocations is 80% or more or 90% or more.

In the region (B), the number of basal plane dislocations having the Burgers vector (B) in the specific direction is larger than the number of other basal plane dislocations.

When a manufacturing condition is optimized, in a certain region on the wafer, a ratio ($=n_b*100/(n_b+n_{other})$ (%)) of the number ($n_b$) of basal plane dislocations having the Burgers vector (B) in the specific direction to the sum of the number ($n_b$) of basal plane dislocations having the Burgers vector (B) in the specific direction and the number ($n_{other}$) of other basal plane dislocations is 80% or more or 90% or more.

(2.2 Burgers Vector)

In general, a plurality of regions (A) and of regions (B) exist on the SiC wafer cut from the SiC single crystal manufactured by a method described later.

The Burgers vectors (A) of a dislocation type as the majority in the individual region (A) are each oriented in a specific direction. The region (A) is formed in a position in a <1-100> direction with respect to a facet portion.

Similarly, the Burgers vectors (B) of a dislocation type as the majority in the individual region (B) are each oriented in a specific direction. The region (B) is formed in a position in a <11-20> direction with respect to the facet portion.

The majority of the edge dislocations contained in the individual region (A) have the following Burgers vector (A). In the region (A) located in a specified <1-100> direction as viewed from the center of the facet portion, the Burgers vector (A) is oriented in a direction perpendicular to the specified <1-100> direction. Specifically, the proportion of the edge dislocations having such a Burgers vector (A) is 80% or more, 90% or more, or 95% or more of all the edge dislocations.

Similarly, the majority of the basal plane dislocations contained in the individual region (B) have the following Burgers vector (B). In the region (B) located in a specified <11-20> direction as viewed from the center of a facet portion, the Burgers vector (B) is oriented in a direction parallel to the specified <11-20> direction. Specifically, the proportion of the basal plane dislocation having such a Burgers vector (B) is 80% or more or 90% or more of all the basal plane dislocations.

The term *center of a facet portion* refers to the center of gravity of a facet trace (a region having a dark color with a different doping concentration).

In the exemplary case illustrated in the left drawing of FIG. 1, a [−1100] direction of the SiC wafer corresponds to the longitudinal direction (y direction) of a paper plane, and a [11-20] direction thereof corresponds to the lateral direction (x direction) of the paper plane.

The region (A) is provided in each of the [−1100] direction (the upper part of the wafer, a y-axis direction), a [01-10] direction (the right of the wafer, a direction about 30 degrees inclined from an x axis), and a [−1010] direction (the left of the wafer, a direction about 150 degrees inclined from the x axis).

On the other hand, the region (B) is provided in each of the [−12-10] direction (the obliquely upper right of the wafer, a direction about 60 degrees inclined from the x axis), and a [−2110] direction (the obliquely upper left of the wafer, a direction about 120 degrees inclined from the x axis).

The region (A) located in the [−1100] direction contains many edge dislocations having a Burgers vector in the [11-20] direction or the [−1-120] direction.

Similarly, the region (A) located in the [01-10] direction contains many edge dislocations having a Burgers vector in the [2-1-10] direction or the [−2110] direction.

Similarly, the region (A) located in the [−1010] direction contains many edge dislocations having a Burgers vector in the [−12-10] direction or the [1-210] direction.

The region (B) located in the [−12-10] direction contains many basal plane dislocations having a Burgers vector in the [−12-10] direction or the [1-210] direction.

Similarly, the region (B) located in the [−2110] direction contains many basal plane dislocations having a Burgers vector in the [−2110] direction or the [2-1-10] direction.

(2.3 Facet Portion)

The facet portion is varied in formation position thereof depending on a method of manufacturing the SiC single crystal.

For example, when the SiC single crystal is manufactured using an offset substrate, the facet portion is formed at an end of the single crystal. A region, which is relatively wide compared with other regions and contains many dislocations of a specific type having a Burgers vector in a specific direction, is formed in a direction opposite to a direction of the facet portion (in a direction given by 180-degrees rotation about the center of the single crystal).

In the region formed in the opposite direction, there are a case where the unevenly-distributed dislocation type is mainly the edge dislocation (i.e., a case where the region (A) is formed), and a case where the unevenly-distributed dislocation type is mainly the basal plane dislocation (i.e., a case where the region (B) is formed).

Whether the region formed in the opposite direction is the region (A) or the region (B) is varied depending on an offset direction of a seed crystal used in manufacturing of the SiC single crystal.

On the other hand, when the SiC single crystal is manufactured using an onset substrate, the facet portion is formed in the center of the single crystal. In this case, regions, which each contain many dislocations of a specific type having a Burgers vector in a specific direction, are radially formed about the facet portion.

3. SiC Wafer

When the above-described SiC single crystal is sliced into an appropriate thickness, a SiC wafer is produced. At this time, when a slicing direction is optimized, the offset direction and a position of the region (A) or the region (B) can be appropriately controlled.

For example, in the case of a SiC single crystal in which the facet portion exists at an end of the SiC single crystal, and the region (A) or the region (B) exists in a direction opposite to a direction of the facet portion, when the SiC single crystal is sliced substantially parallel to a c-plane, a SiC wafer can be cut out, the SiC wafer having a sliced plane that has an offset direction of the <1-100> direction and having the region (A) at an end opposite to the facet portion.

In such a SiC wafer, the {11-20} plane is perpendicular to a wafer surface. As well known, SiC has high carrier mobility in an in-plane direction of the {11-20} plane. For example, a device having a trench structure perpendicular to a wafer surface exhibits maximum mobility at an offset in a <1-100> direction. With such a device, many devices that each have a decreased density of basal plane dislocations of a substrate can be advantageously fabricated from the SiC wafer.

For example, in the case of a SiC single crystal in which the facet portion exists at an end of the SiC single crystal, and the region (A) or the region (B) exists in a direction opposite to a direction of the facet portion, when the SiC single crystal is sliced substantially parallel to a c-plane, a SiC wafer can be cut out, the SiC wafer having a sliced plane that has an offset direction of the <11-20> direction and having the region (B) at an end opposite to the facet portion.

Such a SiC wafer has a typical offset direction, and therefore advantageously allows fabrication of many devices that each have a relatively small number of edge dislocations of a substrate compared with a typical device.

In the case of a SiC single crystal in which the facet portion exists substantially at the center of the SiC single crystal, when the SiC single crystal is sliced substantially parallel to a c-plane, a SiC wafer can be cut out, the SiC wafer having a sliced plane that has an offset direction of the <1-100> direction.

Such a SiC wafer advantageously allows examination of influence of each dislocation type or each Burgers vector on a device of a trench gate structure having carrier mobility in the in-plane direction of the {11-20} plane.

In the case of a SiC single crystal in which the facet portion exists substantially at the center of the SiC single crystal, when the SiC single crystal is sliced substantially parallel to a c-plane, a SiC wafer can be cut out, the SiC wafer having a sliced plane that has an offset direction of the <11-20> direction.

Such a SiC wafer advantageously allows, for a typical device, examination of influence of each dislocation type or each Burgers vector on a device.

Furthermore, the SiC wafer produced in this way allows an orientation flat portion (a deficient portion as a mark of wafer orientation) to be provided in a direction of the region (B).

In such a SiC wafer, the orientation flat portion is provided in the direction of the region (B); hence, the region (B) is assigned to the deficient portion of the wafer. As a result, it is possible to produce a wafer having a relatively small number of basal plane dislocations compared with a case where the region (B) is not assigned to the deficient portion of the wafer.

4. SiC Substrate

A SiC substrate according to the present invention is produced by
cutting a SiC wafer from the SiC single crystal according to the present invention in a direction substantially parallel to a c-plane of the SiC single crystal, and
cutting the SiC substrate from the SiC wafer such that the SiC substrate mainly contains one of the region (A) and the region (B).

The upper right drawing and the lower right drawing of FIG. 1 are schematic diagrams of SiC substrates cut from the SiC wafer.

When a substrate having a predetermined size is cut from a region located in the [−1100] direction of the wafer illustrated in the left drawing of FIG. 1, as illustrated in the upper right drawing of FIG. 1, a SiC substrate is produced, the SiC substrate mainly containing edge dislocations that each have a Burgers vector (A) in a specific direction.

Similarly, when a substrate having a predetermined size is cut from a region located in the [−12-10] direction of the wafer illustrated in the left drawing of FIG. 1, as illustrated in the lower right drawing of FIG. 1, a SiC substrate is produced, the SiC substrate mainly containing basal plane dislocations that each have a Burgers vector (B) in a specific direction.

The meaning of *region (A) is mainly contained* is that 50% or more of area of the SiC substrate includes the region (A).

When size and a cutting position of the SiC substrate are optimized, in the SiC substrate, a ratio ($=n_e*100/(n_e+n_{other})$) (%)) of the number ($n_e$) of edge dislocations having a Burgers vector (A) in a specific direction to the sum of the number ($n_e$) of the edge dislocations having the Burgers vector (A) in the specific direction and the number ($n_{other}$) of other edge dislocations is 80% or more or 90% or more.

The meaning of *region (B) is mainly contained* is that 50% or more of area of the SiC substrate includes the region (B).

When size and a cutting position of the SiC substrate are optimized, in the SiC substrate, a ratio ($=n_b*100/(n_b+n_{other})$) (%)) of the number ($n_b$) of basal plane dislocations having a Burgers vector (B) in a specific direction to the sum of the number ($n_b$) of the basal plane dislocations having the Burgers vector (B) in the specific direction and the number ($n_{other}$) of other basal plane dislocations is 80% or more or 90% or more.

The proportion of a dislocation type having a Burgers vector in a specific direction contained in a SiC substrate depends on size and/or a cutting position of the SiC substrate. As described above, each of the region (A) and the region (B) is formed in a specific direction with respect to the facet portion. As a result, the proportion of the dislocation type having the Burgers vector in the specific direction decreases with an increase in deviation of the cutting position of the SiC substrate from the specific direction or an increase in size of the SiC substrate.

Moreover, when the SiC wafer and the SiC substrate are cut from the SiC single crystal, the offset direction of each of the wafer and the substrate can be appropriately selected.

For example, when the SiC substrate is cut from the region (B), the wafer and the substrate can be cut such that the offset direction is substantially perpendicular to the Burgers vector (B) of the basal plane dislocation. When an epitaxial film is formed on a surface of such a SiC substrate, most basal plane dislocations can be converted into edge dislocations.

When the SiC substrate is cut from the region (A), the wafer and the substrate can be cut such that the offset direction is substantially perpendicular to the Burgers vector (A) of the edge dislocation. When an epitaxial film is formed on the surface of such a SiC substrate, the epitaxial film can be formed while edge dislocations in the substrate are left as the edge dislocations without being converted into basal plane dislocations regardless of magnitude of an offset angle of the substrate.

5. SiC Device

The SiC device according to the present invention is fabricated using the SiC substrate according to the present invention.

The SiC substrate according to the present invention mainly contains a specific dislocation type having a Burgers vector in a specific direction (in other words, the SiC substrate according to the present invention slightly contains or does not substantially contain a specific dislocation type having a Burgers vector in a specific direction). As a result, degradation in device characteristics due to a specific dislocation type can be suppressed.

For example, when a bipolar device is fabricated on a SiC substrate containing the region (A), forward degradation can be suppressed since the number of basal plane dislocations is small.

6. Method of Manufacturing SiC Single Crystal

The SiC single crystal according to the present invention is produced by growing a SiC single crystal on a growth plane of a SiC seed crystal having a specific structure.

To manufacture the SiC single crystal according to the present invention, the SiC seed crystal and a growth process of the SiC single crystal must each satisfy the following condition.

First, the SiC seed crystal must be cut from a SiC single crystal (so-called, a-plane grown crystal) that has been grown with a plane having an offset angle from a {0001} plane of 60 to 90 degrees. The a-plane grown crystal has a low screw dislocation density; hence, when a single crystal is newly grown using the a-plane grown crystal as a seed crystal, a high-quality single crystal is produced.

Second, the SiC seed crystal must be a so-called seed crystal for c-plane growth. In this case, the SiC seed crystal may be either an offset substrate or an onset substrate.

Third, in the SiC seed crystal, a growth plane is configured of three or more non-parallel planes, and an angle defined by an intersection line (a ridge line) between the planes and a {0001} plane must be 2.3 degrees or more except for a region where the c-plane facet is formed (a region near an intersection of the planes).

When an angle of a ridge line between the planes is equal to or less than a predetermined value, a shape of the c-plane facet can be reduced in an initial stage of growth. Moreover, since the shape of the c-plane facet is reduced, a region for supplying a screw dislocation to the c-plane facet (for example, a screw dislocation formable region to be a supply source of a screw dislocation) can be reduced.

Fourth, in growth of SiC, SiC must be grown while a shape of a growth plane is maintained by controlling temperature distribution such that a facet position is not significantly shifted from a specified position on a seed crystal.

Any of various growth processes may be used as the growth process of the SiC single crystal without limitation. The growth process of the SiC single crystal includes a sublimation-reprecipitation process, a CVD process, and a solution process.

Growth of the SiC single crystal using such a SiC seed crystal and a growth process of SiC leads to not only reduction in dislocation density, but also production of a SiC single crystal in which dislocations of a specific type having a Burgers vector in a specific direction are unevenly distributed in a specific region.

7. Effects

In the case of c-plane growth of the SiC single crystal, when a shape of the seed crystal (i.e., a shape of the c-plane facet in an initial stage of growth, size of a region for supplying a screw dislocation to the c-plane facet, etc.) and a growth condition are optimized, the SiC single crystal, in which a specific dislocation type having a Burgers vector in a specific direction unevenly exists in a specific region, is produced. When the SiC substrate is cut from such a SiC single crystal, and when a cutting position and size are each optimized, a SiC substrate that mainly contains a specific dislocation type (in other words, a SiC substrate that does not substantially contain or slightly contains a specific dislocation type) is produced.

When a SiC device is fabricated using such a SiC substrate, degradation in characteristics due to a specific dislocation type can be suppressed. Similarly, when a SiC single crystal is grown using such a SiC substrate as a seed crystal, and when a SiC device is fabricated using the SiC single crystal, degradation in characteristics due to the specific dislocation type can be suppressed.

Specifically, fabricating a device using the SiC substrate containing the region (A) makes it possible to suppress degradation in device characteristics due to basal plane dislocation.

In the case of fabricating a device using a SiC substrate containing the region (B), when an offset direction of the SiC substrate is controlled, a basal plane dislocation can be efficiently converted into an edge dislocation during formation of an epitaxial film.

The SiC single crystal according to the present invention allows distribution of dislocation density to be predicted. As a result, a quality inspection can be exclusively performed on a device that is fabricated using a SiC substrate cut from a low-quality portion having a high dislocation density. In other words, a quality inspection of a device can be simplified.

Moreover, use of the SiC wafer cut from the SiC single crystal according to the present invention makes it possible to evaluate dislocation density over the entire wafer using transmission topography.

Furthermore, use of a seed crystal having uniformly arranged Burgers vectors allows a dislocation to be easily removed from a single crystal or a thin film formed on the surface of the seed crystal.

EXAMPLE

Example 1

1. Sample Preparation

A seed crystal for c-plane growth, of which the offset direction was a <1-100> direction, was cut from a crystal that was formed by repeating a-plane growth five times while a growth direction was changed. Subsequently, the surface of the seed crystal was processed such that a growth plane was configured of three planes, and an angle defined by a ridge line between the planes and a {0001} plane was 2.7 degrees.

Furthermore, a screw dislocation formable region that allowed formation of a screw dislocation was formed near an intersection between the three planes.

A SiC single crystal was grown by the sublimation-reprecipitation process using the resultant seed crystal. The growth was performed while a highest point of the {0001} plane, which was formed by the three planes within the screw dislocation formable region, was disposed close to the center of a crucible such that the neighborhood of the highest point of the {0001} plane was maintained at lowest temperature during the growth.

2. Test Procedure

A SiC wafer was cut from the SiC single crystal so as to be substantially parallel to the c-plane. The SiC wafer was subjected to dislocation analysis with transmission X-ray topography and reflection X-ray topography.

3. Results

3.1 Determination of Dislocation Type with Transmission X-Ray Topography

FIG. 2 illustrates exemplary transmission X-ray topography images for explaining a determination method of a dislocation type with transmission X-ray topography. The central drawing of FIG. 2 illustrates a transmission X-ray topography image of (1-100) plane diffraction of a crystal having a relatively low dislocation density. The left drawing (a small drawing) of FIG. 2 illustrates a transmission X-ray topography image of an existing crystal having a high dislocation density.

As illustrated in FIG. 2, the basal plane dislocation typically has a length equal to or larger than thickness of a sample, and is shown as a line having a medium contrast. The edge dislocation (threading edge dislocation) has a length that is about equal to thickness of the sample, and is shown as a line having a low contrast. Furthermore, when a Burgers vector of the threading screw dislocation contains a component in an in-plane direction of the {0001} plane, the threading screw dislocation is shown as dots having a high contrast.

In the existing crystal (high dislocation density crystal), the edge dislocation has not been typically observed with the transmission X-ray topography image using a substrate substantially parallel to a c-plane. One reason for this is as follows. In the existing crystal in which basal plane dislocations exist at high density, a clear image of an edge dislocation, which is short and low in contrast, has not been observed as illustrated in the left drawing of FIG. 2.

However, when the dislocation density is reduced, as illustrated in the central drawing of FIG. 2, the edge dislocation can be observed by transmission X-ray topography even if the substrate is substantially parallel to the c-plane.

FIG. 3 illustrates a transmission X-ray topography image (the left drawing) and a reflection X-ray topography image (the right drawing) photographed in the same region of a SiC wafer.

In the transmission X-ray topography image in the left drawing of FIG. 3,
(a) a short and low-contrast line is shown by a small thin-line circle, and
(b) a short and high-contrast line is shown by a large thick-line circle.

A position of each circle obtained in the left drawing was superposed on a reflection topography image to be used for determination of an edge dislocation or a screw dislocation. As a result, it was confirmed that the small thin-line circle corresponded to an edge dislocation, and the large thick-line circle corresponded to a screw dislocation. This result shows that when the dislocation density is reduced, the edge dislocation can also be observed by a transmission X-ray topography image of a substrate that is substantially parallel to the c-plane.

3.2 Specification of Direction of Burgers Vector of Edge Dislocation

3.2.1 Region in [-1100] Direction

Three equivalent diffraction operations of transmission X-ray topography were performed to obtain a direction of a Burgers vector of a dislocation. FIG. 4 illustrates a (1-100) plane diffraction image (the upper left drawing), a (-1010) plane diffraction image (the upper central drawing), and a (01-10) plane diffraction image (the upper right drawing) in the same region that is located in a [-1100] direction with respect to a facet portion, and contains unevenly distributed edge dislocations.

In this region, edge dislocations were mainly observed. Among the three equivalent diffraction images photographed in the same region, dislocation images disappear only in the (1-100) plane diffraction. This suggests that such edge dislocations each have a Burgers vector perpendicular to the g vector (a normal vector to a diffraction plane) of the diffraction, i.e., a Burgers vector in a [11-20] direction (a positive direction and a negative direction are assumed to be equal to each other, the same holds true below.).

FIG. 5 illustrates a schematic diagram of a SiC wafer (the upper left drawing), a 2-2010-diffraction reflection-X-ray topography image photographed in a region located in a [-1100] direction with respect to a facet portion (the lower left drawing), and a 11-28-diffraction reflection-X-ray topography image photographed in the same region (the upper right drawing).

In the 11-28-diffraction reflection-X-ray topography image (the upper right drawing of FIG. 5), edge dislocations enclosed by dot-line circles and edge dislocations enclosed by solid-line circles are observed. On the other hand, in the 2-2010-diffraction reflection-X-ray topography image photographed in the same region (the lower left drawing of FIG. 5), the edge dislocations enclosed by the dot-line circles disappear.

The number of edge dislocations enclosed by the dot-line circles was 100 in total within an observed viewing field. Such dislocations disappear in (2-2010) plane diffraction, which shows that a direction of a Burgers vector of the dislocation is a [11-20] direction (a horizontal direction of a paper plane (an x-axis direction)). On the other hand, the number of edge dislocations enclosed by the solid-line circles was three in total within the observed viewing field. Such dislocations do not disappear in both the diffraction images, which shows that a direction of a Burgers vector of the dislocation is in a [-12-20] direction (a direction inclined 60 degrees from the x-axis direction) or a [-2110] direction (a direction inclined 120 degrees from the x-axis direction).

FIG. 5 reveals that 97% of the edge dislocations in the region located in the [-1100] direction have Burgers vectors in the same direction.

3.2.2 Region in [01-10] Direction

FIG. 6 illustrates a (1-100) plane diffraction image, a (-1010) plane diffraction image, and a (01-10) plane diffraction image in the same region that is located in a [01-10] direction with respect to a facet portion, and contains unevenly distributed edge dislocations.

In this region, edge dislocations were mainly observed. Among the three equivalent diffraction images photographed in the same region, dislocation images disappear only in the (01-10) plane diffraction. This suggests that such edge dislocations each have a Burgers vector perpendicular to the g vector of the diffraction, i.e., a Burgers vector in a [−2110] direction.

3.2.3 Region in [−1010] Direction

FIG. 7 illustrates a (1-100) plane diffraction image, a (−1010) plane diffraction image, and a (01-10) plane diffraction image in the same region that is located in a [−1010] direction with respect to a facet portion, and contains unevenly distributed edge dislocations.

In this region, edge dislocations were mainly observed. Among the three equivalent diffraction images photographed in the same region, dislocation images disappear only in the (−1010) plane diffraction. This suggests that such edge dislocations each have a Burgers vector perpendicular to the g vector of the diffraction, i.e., a Burgers vector in a [1-210] direction.

3.3 Specification of Direction of Burgers Vector of Basal Plane Dislocation

3.3.1 Region in [−2110] Direction

FIG. 8 illustrates a (1-100) plane diffraction image, a (−1010) plane diffraction image, and a (01-10) plane diffraction image in the same region that is located in a [−2110] direction with respect to a facet portion, and contains unevenly distributed basal plane dislocations.

In this region, basal plane dislocations were mainly observed. Among the three equivalent diffraction images photographed in the same region, dislocation images disappear only in the (01-10) plane diffraction. This suggests that such basal plane dislocations each extend in the [−2110] direction and have a Burgers vector perpendicular to the g vector of the diffraction, i.e., a Burgers vector in the [−2110] direction.

3.3.2 Region in [−12-10] Direction

FIG. 9 illustrates a (1-100) plane diffraction image, a (−1010) plane diffraction image, and a (01-10) plane diffraction image in the same region that is located in a [−12-10] direction with respect to a facet portion, and contains unevenly distributed basal plane dislocations.

In this region, basal plane dislocations were mainly observed. Among the three equivalent diffraction images photographed in the same region, dislocation images disappear only in the (−1010) plane diffraction. This suggests that such basal plane dislocations each extend in the [−12-10] direction and have a Burgers vector perpendicular to the g vector of the diffraction, i.e., a Burgers vector in the [−12-10] direction.

3.4 Determination Method with Image Processing

Operation of determining density of dislocations having a Burgers vector in a specific direction from the transmission X-ray topography images as described above can be promptly performed using image processing, etc.

Dislocation is determined based on features (length and contrast) of each dislocation type given from each topography image. The topography image is divided into segments having a certain size, and number density of dislocations of each type is obtained in the individual segments. Since the number density of dislocations in each segment corresponds to number density of dislocations having Burgers vectors in two directions, three equivalent topography images are used to obtain number density of Burgers vectors of one type in that segment.

The respective number densities of dislocations having Burgers vectors in three directions are temporarily denoted as x, y, and z. The number densities of dislocations in equivalent segments of the respective topography images are temporarily denoted as a, b, and c. At this time, such variables are represented as a=x+y, b=y+z, and c=z+x.

When such equations are solved, x=(a+c−b)/2, y=(a+b−c)/2, and z=(c+b−a)/2 are given. Specifically, the number density of dislocations having a Burgers vector in a specific direction can be obtained from three topography images in the equivalent segments.

The dislocation structure of the SiC single crystal illustrated in the left drawing of FIG. 1 is obtained through such dislocation analysis using the topography images.

Example 2

1. Sample Preparation

A seed crystal for c-plane growth, of which the offset direction was a <11-20> direction, was cut from a crystal that was formed by repeating a-plane growth five times while a growth direction was changed. Subsequently, a surface of the seed crystal was processed such that a growth plane was configured of three planes, and an angle defined by a ridge line between the planes and a {0001} plane was 2.7 degrees. Furthermore, a screw dislocation formable region that allowed formation of a screw dislocation was formed near an intersection between the three planes.

A SiC single crystal was grown by the sublimation-reprecipitation process using the resultant seed crystal. The growth was performed while a highest point of a {0001} plane, which was formed by the three planes within the screw dislocation formable region, was disposed close to the center of a crucible such that the neighborhood of the highest point of the {0001} plane was maintained at lowest temperature during the growth.

2. Results

As with Example 1, distribution of each dislocation type and a direction of each Burgers vector were determined using X-ray topography. As a result, in a <1-100> direction, edge dislocations were mainly observed, and a direction of each Burgers vector was confirmed to be oriented in a specific direction in each region (a direction perpendicular to a direction toward that region as viewed from a facet portion). In a <11-20> direction, a basal plane dislocation region, which had a Burgers vector in a specific direction (a direction parallel to a direction toward the region as viewed from the facet portion), was observed (see FIG. 10).

Example 3

1. Sample Preparation

A seed crystal for onset c-plane growth (the seed crystal had an onset bottom face) was cut from a crystal that was formed by repeating a-plane growth five times while a growth direction was changed. Subsequently, a surface of the seed crystal was processed such that a growth plane was configured of three planes, and an angle defined by a ridge line between the planes and a {0001} plane was 2.7 degrees. Furthermore, a screw dislocation formable region that allowed formation of a screw dislocation was formed near an intersection between the three planes.

A SiC single crystal was grown by the sublimation-reprecipitation process using the resultant seed crystal. In growth using an onset substrate, size of a facet is particularly easily increased during growth. Thus, to suppress this, the growth was performed while a site (near the center) of a seed-crystal holding base, which corresponded to the neighborhood of a highest point of the {0001} plane formed by the three planes, was processed thin to improve heat radiation in order to accelerate a growth rate of the neighborhood of the highest point.

2. Results

As with Example 1, distribution of each dislocation type and a direction of each Burgers vector were determined using X-ray topography. As a result, radial dislocation distribution about the facet portion was observed. In a <1-100> direction, edge dislocations were mainly observed, and a direction of each Burgers vector was confirmed to be oriented in a specific direction in each region (a direction perpendicular to a direction toward that region as viewed from a facet portion). In a <11-20> direction, a basal plane dislocation region, which had a Burgers vector in a specific direction (a direction parallel to a direction toward the region as viewed from the facet portion), was observed (see FIG. 11).

Although an embodiment of the present invention has been described in detail hereinbefore, the present invention should not be limited thereto, and various modifications or alterations thereof may be made within the scope without departing from the spirit of the present invention.

INDUSTRIAL APPLICABILITY

The SiC single crystal and the SiC substrate according to the present invention can be used for manufacture of a semiconductor material for ultra-low-power-loss power devices.

The invention claimed is:

1. A SiC single crystal, comprising:
in a plane substantially parallel to a c-plane,
(a) a region (A) in which a majority of edge dislocations have Burgers vectors pointing in a same direction, and
(b) a region (B) that is different from region (A) and in which a majority of basal plane dislocations have Burgers vectors pointing in a same direction.

2. The SiC single crystal according to claim 1, further comprising:
a facet portion,
wherein the region (A) is located in a <1-100> direction with respect to the facet portion, and
the region (B) is located in a <11-20> direction with respect to the facet portion.

3. The SiC single crystal according to claim 2, wherein the facet portion exists at an end of the SiC single crystal, and one of the region (A) and the region (B) exists in a direction opposite to a direction of the facet portion.

4. The SiC single crystal according to claim 2, wherein the facet portion exists substantially at a center of the SiC single crystal.

5. A SiC wafer, wherein the SiC wafer is a slice from the SiC single crystal according to claim 3 in a direction substantially parallel to a c-plane of the SiC single crystal,
a sliced plane has an offset direction of a <1-100> direction, and
the region (A) is provided at an end opposite to the facet portion.

6. A SiC wafer, wherein the SiC wafer is a slice from the SiC single crystal according to claim 3 in a direction substantially parallel to a c-plane of the SiC single crystal,
a sliced plane has an offset direction of a <11-20> direction, and
the region (B) is provided at an end opposite to the facet portion.

7. A SiC wafer, wherein the SiC wafer is a slice from the SiC single crystal according to claim 4 in a direction substantially parallel to a c-plane of the SiC single crystal, and
a sliced plane has an offset direction of a <1-100> direction.

8. A SiC wafer, wherein the SiC wafer is a slice from the SiC single crystal according to claim 4 in a direction substantially parallel to a c-plane of the SiC single crystal, and
a sliced plane has an offset direction of a <11-20> direction.

9. The SiC wafer according to claim 5 wherein an orientation flat portion (a deficient portion as a mark of wafer orientation) is provided in a direction of the region (B).

10. A SiC substrate, wherein the SiC substrate is produced by cutting a SiC wafer from the SiC single crystal according to claim 1 in a direction substantially parallel to a c-plane of the SiC single crystal, and
cutting the SiC substrate from the SiC wafer such that the SiC substrate mainly contains one of the region (A) and the region (B).

11. The SiC substrate according to claim 10, wherein the SiC substrate contains the region (A), and
an offset direction is substantially perpendicular to the Burgers vectors of the majority of edge dislocations in region (A).

12. The SiC substrate according to claim 10, wherein the SiC substrate contains the region (B), and
an offset direction is substantially perpendicular to the Burgers vectors of the majority of basal plane dislocations in region (B).

13. A SiC device, wherein the SiC device is fabricated using the SiC wafer according to claim 5.

14. A SiC device, wherein the SiC device is fabricated using the SiC substrate according to claim 10.

* * * * *